United States Patent [19]

Thiele

[11] Patent Number: 4,884,235
[45] Date of Patent: Nov. 28, 1989

[54] MICROMAGNETIC MEMORY PACKAGE

[76] Inventor: Alfred A. Thiele, 262 N. Dithridge St., No. 306, Pittsburgh, Pa. 15213

[21] Appl. No.: 221,349

[22] Filed: Jul. 19, 1988

[51] Int. Cl.⁴ .................. G11C 5/04; G11C 19/08
[52] U.S. Cl. .................................... 365/2; 365/53
[58] Field of Search .............................. 365/2, 53

[56] References Cited

U.S. PATENT DOCUMENTS

| 3,971,126 | 7/1976 | Buhrer | 365/2 |
| 4,017,604 | 4/1977 | Naden et al. | 365/2 |
| 4,018,491 | 4/1977 | Niedzwiecke et al. | 365/2 |

Primary Examiner—James W. Moffitt
Attorney, Agent, or Firm—Birch, Stewart, Kolasch & Birch

[57] ABSTRACT

A package comprised of a plurality of truncated confocal, ellipsoidal layers of substantially equal length and having a common opening therethrough along a central axis for receiving a micromagnetic memory therein, typically a vertically stacked bubble memory. The layers include at least one outermost layer of first type ferromagnetic material having a permeability for providing a shield against external fields, at least one inner layer of a second type ferromagnetic material having a permanent magnetization for producing a static, internal, uniform bias field transverse to the central axis for a bubble memory element of the memory, two adjacent layers of electromagnetic coils for generating an internal time varying transverse and axial fields for controlling the bubble memory element, and preferably at least one "leaky shield" layer of a third type ferromagnetic material interposed between the inner layer of second type ferromagnetic material and the electromagnetic coil layers for providing a flux return path for the field generated by the coil layer and increasing the permeance of the inner layer of second type ferromagnetic material.

16 Claims, 6 Drawing Sheets

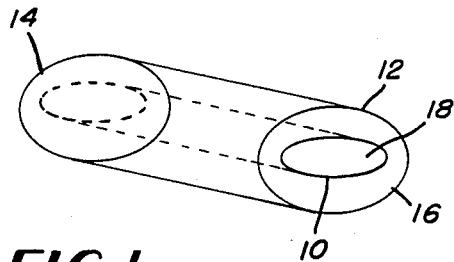
FIG. 1
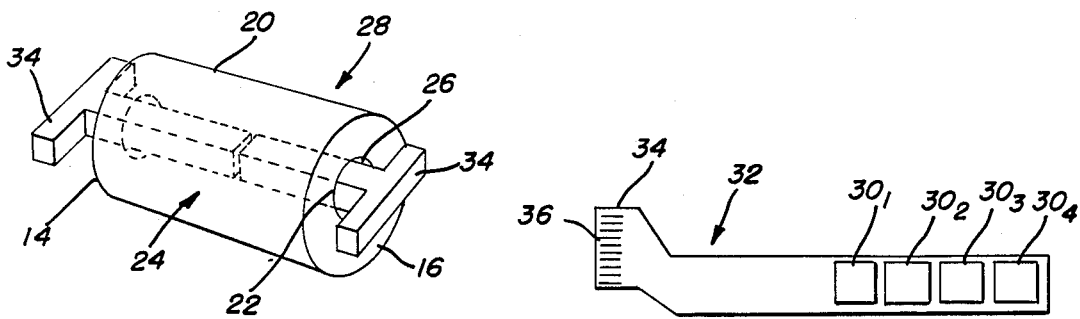
FIG. 2
FIG. 3
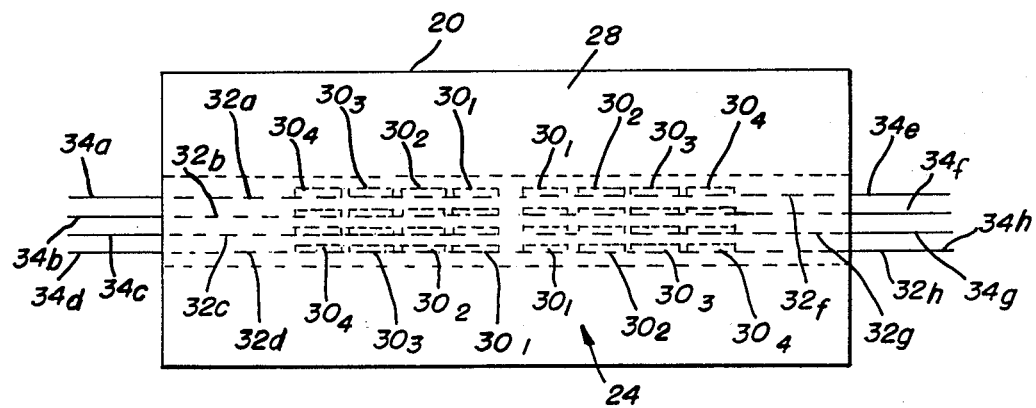
FIG. 4
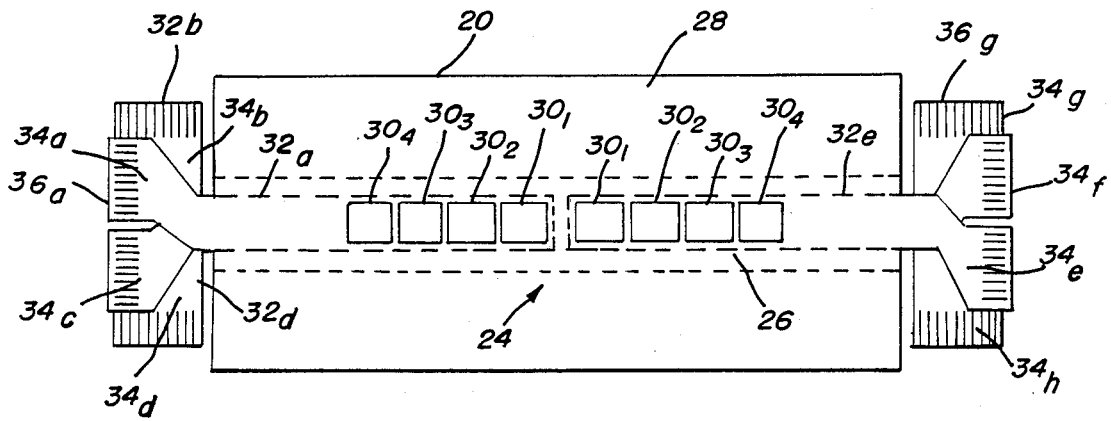
FIG. 5

MICROMAGNETIC MEMORY PACKAGE

BACKGROUND OF THE INVENTION

This invention relates generally to a magnetic structure for housing and controlling a data storage device, and more particularly to a package for a relatively large magnetic bubble or other type micromagnetic memory.

Present packages for magnetic bubble or related micromagnetic memories utilize the package not only for a housing and support function, but also includes means for generating, propagating and holding the data storage element as well as shielding the memory device, referred to as a "chip", from external fields which have a deleterious effect on its operation. Conventional packages also use the symmetry plane of the device structure to achieve the required field uniformity. When it is desirable to operate many bubble chips, for example, in parallel to achieve a high bit rate, large gains in the size and weight and Power performance can be obtained by stacking the bubble chips vertically. A spherical package would be desirable to minimize power but does not permit access to the chips. While known prior art apparatus presumably operates as intended, the structural limitations of the package itself have tended to limit the number of chips per package where a large memory capacity and a high bit rate are required.

SUMMARY

It is an object of the present invention, therefore, to provide an improved structure which provides bias fields, drive fields, and shielding for micromagnetic memory devices.

It is a further object of the invention to provide a memory package which provides reduction in operating power and accordingly the amount of heat which requires dissipation.

It is yet another object of the invention to provide an improvement in a micromagnetic memory package which provides a reduction in size, weight, and cost for a relatively large capacity micromagnetic memory.

It is still a further object of the invention to provide a package for a magnetic bubble or other magnetic micromagnetic memory which exhibits the necessary properties for operation in a relatively harsh environment.

And still yet another object of the invention is to provide a package for a data memory which is non-volatile, radiation resistant, and E-M pulse resistant.

Briefly, the foregoing and other objects of the invention are provided by a package structure comprise of a plurality of truncated confocal, ellipsoidal means layers having a common opening therethrough along a central axis for receiving a micromagnetic memory therein, typically a vertically stacked bubble memory, and where the layers include at least one outermost layer of first type ferromagnetic material having a high permeability for providing the dual functions of a shield against external fields and a flux return path for a permanent magnet layer, at least one inner layer of second type ferromagnetic material having a permanent magnetization for producing a static, internal, uniform field transverse to said central axis for biasing a data storage element of the memory, at least one layer comprising an electromagnetic coil for generating an internal time varying field for controlling a memory element in said memory, and a "leaky shield" layer of ferromagnetic material of relatively low or intermediate permeability interposed between the inner layer of second type ferromagnetic material and the electromagnetic coil layer for providing a flux return path for the field generated by the coil layer and increasing the permeance of the inner layer of second type ferromagnetic material.

In its preferred form, the package includes first and second interior electromagnetic coil layers for generating respective axial and transverse fields for propagating the memory bits, which may be, for example, a bubble. A third electromagnetic coil layer can be provided for generating a second transverse field for erasure. The outer layer of first type ferromagnetic type material may also be comprised of two or more soft magnetic material elements, the outer layers of which provide shielding while the inner one provides a flux return path for the static field. The inner layer of second type ferromagnetic material comprises a pair of permanent magnet elements of hard magnetic material for producing a memory bias and holding field for the memory element. The purpose of splitting the permanent magnet layer into two layers is to permit adjustment of the bias field magnitude. The adjustment is achieved by mechanically rotating the two layers; however, this can only be done if the elements are circular cylinders. Accordingly, the confocal, ellipsoidal means layers preferably comprise a plurality of contiguous circular cylinders which operate to produce a uniform field over its interior volume. Access to the memory located within the package is provided at either end of the composite structure.

BRIEF DESCRIPTION OF THE DRAWING

The following detailed description of the invention will be more fully understood when considered in conjunction with the accompanying drawings wherein:

FIG. 1 is a perspective view generally illustrative of a three dimensional truncated confocal ellipsoidal cylinder;

FIG. 2 is a perspective view illustrative of a special confocal ellipsoidal structure comprising a circular cylinder and utilized to house a micromagnetic memory in accordance with the subject invention;

FIG. 3 is a top plan view illustrative of a plurality of micromagnetic bubble chips mounted on an elongated submodule tray;

FIG. 4 is a side elevational view broadly illustrative of the subject invention;

FIG. 5 is a top elevational view of the structure shown in FIG. 4;

DETAILED DESCRIPTION OF THE INVENTION

Figure 7:
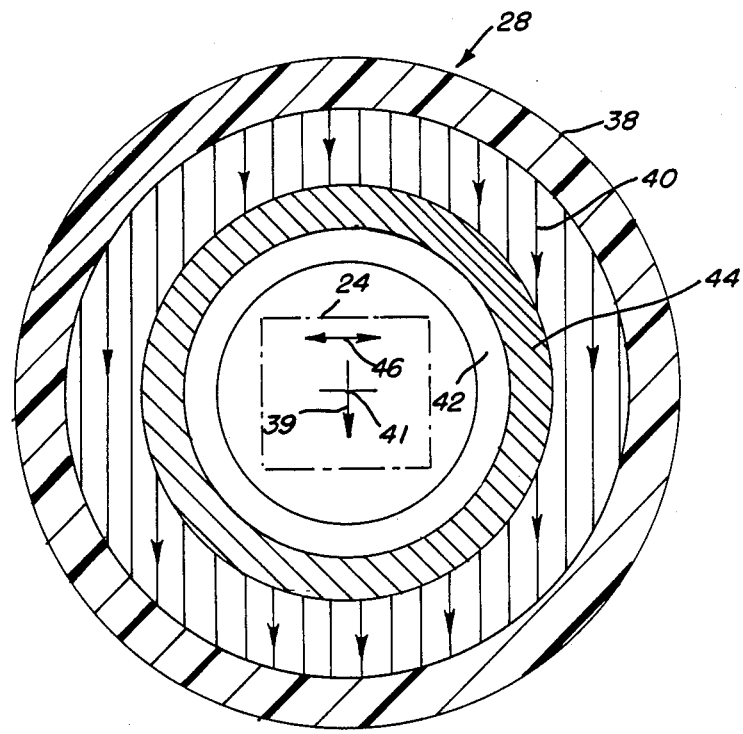
FIG. 7 is a transverse sectional view illustrative of a first embodiment of a package structure for a memory in accordance with the invention.

This invention is directed to a package for a large, gigabit range micromagnetic memory and more particularly to a bubble memory or related device. The package to be described hereinafter performs several functions including: providing a mechanical housing for the memory, generating the static bias field necessary for the existence of the bubbles, generating the time varying drive fields necessary for propagating the bubbles, providing a shield from external fields, and providing mechanical access for electrical leads to a plurality of stacked memory chips located within the package structure.

The subject invention is based on two principles. The first is that in devices where surface currents produce volume fields, including inductors and transformers, efficiency increases with scale and is maximized for a spherical configuration. This occurs because the dissipation occurs at the surface while energy is stored in the inner volume. The second principle is that a required uniformity of an internal field can be achieved by utilizing magnetic structures whose surfaces are confocal ellipsoids.

Referring now to the drawings wherein like reference numerals refer to like components throughout, the structure of FIG. 1 is generally illustrative of a truncated ellipsoidal cylinder having inner and outer surfaces 10 and 12 of ellipsoidal cross section and including a pair of end faces 14 and 16 which provide access to an ellipsoidal inner volume 18. However, if one sets the two transverse axes to be equal, it becomes circular. And if one lets the third or longitudinal axis go to infinity, it becomes cylindrical. The truncated structure of FIG. 1 becomes circular in cross section, as shown in FIG. 2. There reference numeral 20 defines an outer circular cylinder while reference numeral 22 defines an inner circular cylinder, with the two cylinders being concentric along a common central axis. Thus the cylindrical configuration of FIG. 2 is a special case of a confocal truncated ellipsoid of FIG. 1. Accordingly, the present invention has for its purpose the location of the micromagnetic memory 24, further shown in FIGS. 4, 5 and 6, within the columnar interior space 26 of a cylindrical structure 28 of the type shown in FIGS. 7, 8 and 9.

It can be shown that when all the elements are confocal as in FIGS. 1 and 2, the resultant field produced inside the structure is uniform away from the ends 14 and 16 and the outside field is modified by its presence and contains a component which asymtotically becomes a dipole field at large distances The shield layer, however, reduces the dipole field to near zero in its flux return role. In the intermediate regions of the structure, i.e. regions other than the inner or outer regions, the field is a linear superposition of two components, a uniform component and a "dipole" component, wherein the "dipole" component becomes a dipole field at infinity. The effect of the boundary conditions is to change the relative size of the two components in adjacent regions but without introducing additional components. The boundary conditions together with the configuration of the two field components thus uniquely determine the fields within the structure. The two boundary conditions are that the normal component of the B, field and the tangential component of the H field are continuous.

The fields outside the structure 28 can be described as the negative gradient of a scaler potential. They may also be described in terms of the curl of a vector potential which is also valid within the structure. In either case, the potential satisfies the Laplace equation in source free regions and the Poisson equation where they are sources. Matching a cylindrical $(r, \theta, z)$ coordinate system to the cylindrical structure, the scaler potential is given by $\Omega = (Lr + Dr^{-1}) \cos \theta$ where L and D are the coefficients of the linear and dipole components of the field. Solving the boundary conditions at any angle $\theta$ at which B and H are non-zero, provides a complete solution at all angles since both components have the same angular dependence.

Referring now to FIG. 3, shown thereat are four micromagnetic memory bubble chips $30_1$, $30_2$, $30_3$ and $30_4$ colinearly mounted on an elongated submodule tray 32 having an offset end section 34 containing a plurality of electrical connector elements 36 for providing the required electrical connections between the bubble chips $30_1 \ldots 30_4$ and other apparatus, not shown, with which the memory 24 (FIG. 2) is utilized. The submodule tray 32 is formed, for example, from a thin polyimide carrier or sheet member.

Figure 6:
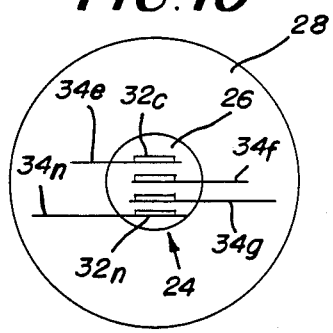
FIG. 6 is an end elevational view of the structure shown in FIGS. 4 and 5.

This now leads to a consideration of FIGS. 4, 5 and 6 wherein there is illustrated an assembly 24 of two opposing four-tiered stacks of bubble chip trays $32_a$, $32_b$, $32_c$, $32_d$ and $32_e$, $32_f$, $32_g$ $32_h$ inserted in the cylindrical cavity 26 of the cylindrical magnetic structure 28 from either end. As shown in FIG. 4, the total assembly includes thirty two bubble chips having respective external connector elements providing access to the respective chips.

A first illustrative embodiment of the invention comprises a relatively simple structure for providing the required uniform fields for the micromagnetic memory 24 and is shown in FIG. 7. There reference numeral 38 denotes an outer cylindrical shell or layer 38 comprised of "soft" magnetic material characterized by a high permeability which both shields the interior from external fields and provides a flux return path for an inner layer 40 of "hard" magnetic material characterized by a permanent magnetization as shown by the indicating arrow in the material in a direction transverse to the central longitudinal axis 41. The permanent magnet layer 40 is also comprised of a circular cylinder. Suitable materials for the permanent magnet layer 40 are barium ferrite, SmCo or FeNdB. Although the permanent magnet material of the layer 40 is shown in contact with the shield layer 38, it should be noted that this is for example only since the properties of uniformity would still be maintained if there is a gap therebetween. In such an instance, the magnitude of the field would be reduced. Thus the magnitude of the static field produced thereby, assuming that the material was uniformly magnetized to a stable point near saturation, is determined by the saturation magnetization and the ratio of the inner diameter to the outer diameter of the cylindrical tubular layer 40 as determined by the field equations. The uniform field 39 generated by the permanent magnet layer 40 is transverse to the central axis 41 and provides a bias and holding field for the bubble chips 30.

FIG. 7 additionally shows the inclusion of an electromagnet coil layer 42 wound to generate a uniform field and is comprised of wires 43 running parallel to the central axis 41 and being separated from the permanent magnet layer 40 by means of a ferromagnetic "leaky shield" layer 44. The purpose of the coil 42 is to act as a drive coil for generating a transverse control or drive field as shown, for example, by the reference numeral 46. The primary function of the "leaky shield" layer 44 is to provide a flux return path for the transverse drive field 46 generated by the inner coil 42 as well as increasing the permeance of the permanent magnet layer 40. Such a configuration could also be utilized in connection with other micromagnetic memories such as a vertical Block line memory, not shown.

Figure 8:
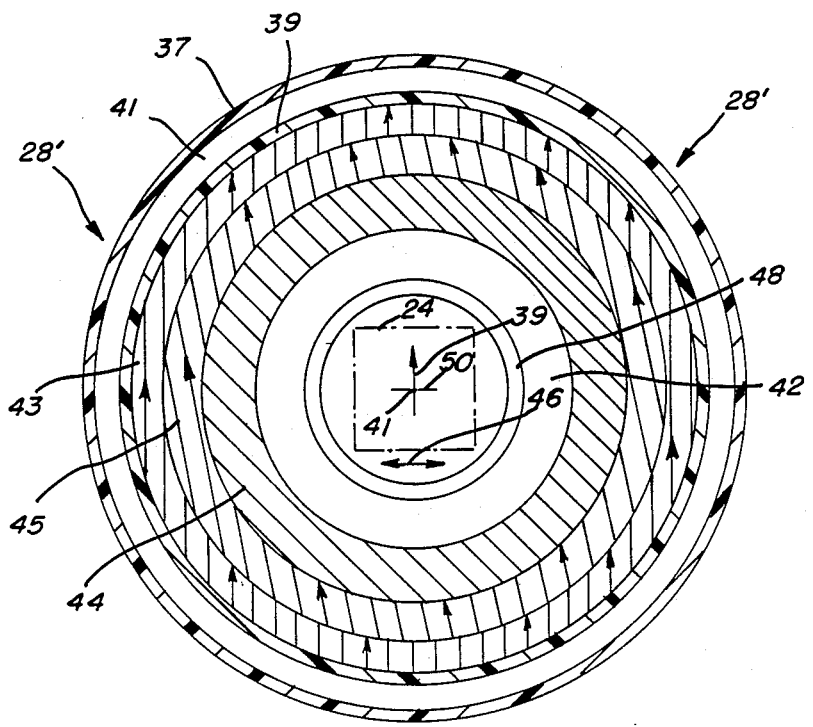
FIG. 8 is a transverse sectional view illustrative of a second embodiment of a package structure in accordance with the subject invention.

A more elaborate embodiment of the memory package structure in accordance with this invention is shown in FIG. 8 and is designated by reference numeral 28'. There the outer shield layer 38 of FIG. 7 is separated into two concentric cylinders $38_a$ and $38_b$ of "soft" magnetic material which are separated by a cylindrical layer 37 of non-magnetic material. This arrangement effectively separates the flux return and shielding functions by having the outermost layer $38_a$ acting as a shield from external fields while the inner cylinder $38_b$ operates as a flux return path for the inner permanent magnet layer. The layering of shielding to increase its effectiveness is well known in the art. Here the permanent magnet layer 40 of FIG. 7 is divided into two annular tubular permanent magnet members $43_a$ and $43_b$. The layers $43_a$ and $43_b$ are normally made of the same material and when assembled in place, they are adapted to be rotated with respect to one another to vary the magnitude of the field without changing its direction. When desirable, however, the permanent magnet layers $43_a$ and $43_b$ may be further sub-divided into layers, of different materials not shown, in order to tailor the magnet for a predetermined temperature characteristic.

As before, a "leaky shield" layer 44 of ferromagnetic material of relatively low or intermediate Permeability is Placed between the permanent magnet portion of the structure 28' and the electromagnet coil 42 used to generate the transverse control field 46. The embodiment of FIG. 7 now includes a second electromagnet coil 48 inside of the coil 42 whose wires are wound transversely around the central axis 41. Coil 42, when energized, generates a time varying axial drive field 50. As before, both coils 42 and 48 are wound and schematically shown to generate uniform fields.

As noted earlier, the primary function of the "leaky shield" layer 44 is to act as a flux return path for the transverse drive field 46. The layer 44 also has the incidental effect of shunting part of the flux from the permanent magnet layers $43_a$ and $43_b$ around the innermost region and increases the permeance of the structure, thereby increasing its stability.

The material from which the layer 44 is formed just be linear and must have low loss at high frequency. Since any ferromagnetic material will become non-linear at high flux density, and since the flux bunches as it passes around the innermost region, it is appropriate to use a permeability, e.g. 10 or less. Slight non-linearities may be compensated by shaping the inner surface, however. This layer will also perform the field homogenizing function required for certain bubble packages. Suitable materials are well known, carbonyl iron balls or ferrite particles in a plastic binder being illustrative examples. Most of the magnetic energy is stored in the non-magnetic regions between the particles so that the material is quite linear until the particles saturate.

The configuration in FIG. 8 illustrates the axial field coil 48 being the innermost coil. The field produced by the transverse field coil 42 is increased by the flux closure provided by the "leaky shield" layer 44. Although the maximum benefit in terms of flux closure is obtained if the permeability of the "leaky shield" layer is large, the reduction in this effect caused by using a relatively low or intermediate permeability is not large since the reluctance of the inner, driven, region is high. The "leaky shield" layer 44 also reduces the amplitude of the drive field which reaches the outer shield members or the permanent magnet layers.

Thus what has been shown with respect to the structure in FIG. 8 is an outer permanent magnet configuration for generating a static bias and holding field transverse to the central longitudinal axis as well as also a pair of inner electromagnet coils for generating respective transverse and axial drive fields for translating which can be used to move the data storage means i.e. the magnetic bubble within a respective bubble chip.

Figure 9:
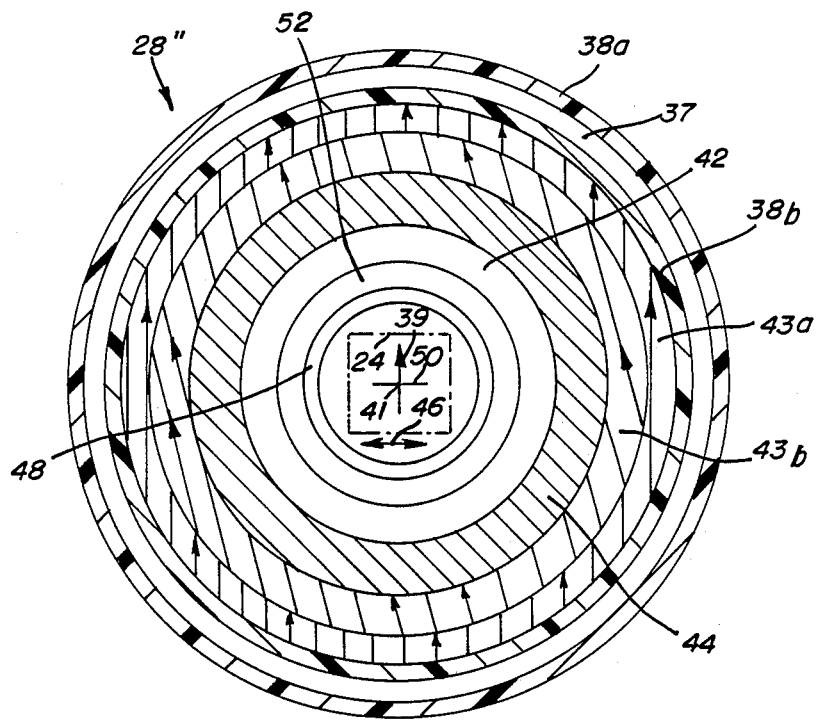
FIG. 9 is a transverse sectional view illustrative of a third embodiment of a package structure in accordance with the invention.

When desirable, a second orthogonal transverse field coil may be added for erasure. This is shown in FIG. 9 by the coil 52 located between the first mentioned transverse field drive coil 42 and the axial field drive coil 48. This coil is also wound to produce a uniform field. Since erasure is done at a low duty cycle, the thickness of the coil 52 can be relatively thinner than that of the outer drive coil 42. This layer may, when desirable, be a pattern printed on a rolled polyimide carrier. Otherwise, it is constructed in the same fashion as the other two drive coils 42 and 48 and which may be formed, for example, of Litz wires in order to carry high frequency current throughout.

Figure 10:
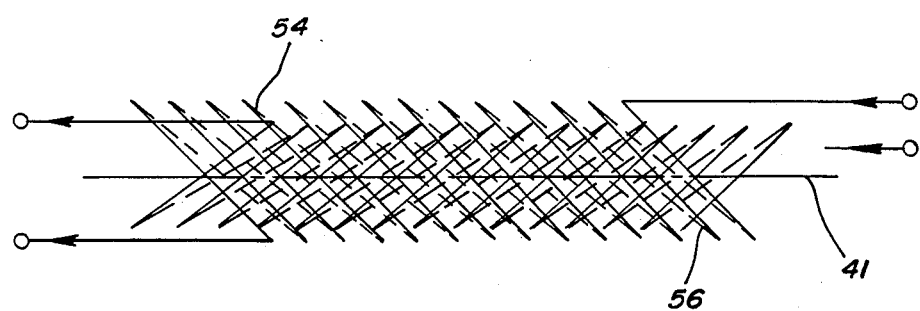
FIG. 10 is a schematic diagram illustrative of a second type of coil configuration which can be utilized in connection with the invention.

While the drive coils shown in FIGS. 7, 8 and 9 are shown configured so that the coil wires run substantially parallel to or perpendicularly around the central longitudinal axis 41, another possible configuration for the drive coils is shown schematically in FIG. 10 where two generally cylindrical coils 54 and 56 are wound at an angle of greater than 45° with respect to the axis 41 in mutually opposite directions, providing a herringbone pattern. The solid lines indicate wires on the front surface of the coil while the dashed lines indicate the wires on the rear surface of the coil. The current which flows in the two drive coils 54 and 56 may be considered as the sum and difference of the current flow in the axial and transverse coils 48 and 42 of FIG. 8. Although the current flow in the coils 54 and 56 are more efficient at producing an axial field than the transverse field even when flux is being returned by a "leaky shield" such as the element 44 of FIG. 8, when the currents are both in the directions indicated by the arrows shown in FIG. 10, a transverse field will be produced. However, when one current in the direction shown by the arrow and the current in the other coil is opposite to the direction shown by the arrow, an axial field is produced. In this configuration, the coils are more symmetrical with the current continuity occurring as an extension of the body of the coil.

Thus what has been shown and described is a magnetic structure whose surfaces generically comprise confocal ellipsoidal surfaces, which in the form of circular cylindrical tubular elements, meets both the access requirements and produces a uniform field over its interior volume except for edge effects caused by the truncation at the end of the tube. In such a structure, the bias and holding fields are transverse to the axis while at least one drive field component is transverse and the other is axial. The inclusion of the "leaky shield" in the combination of elements provides flux return for the transverse drive field and incidentally increases the permeance of the static field producing structure.

Having thus shown and described what is a present considered to be the preferred embodiments of the invention, it should be noted that the same has been made by way of illustration and not of limitation. Accordingly, all alterations, modifications and changes coming within the spirit and scope of the invention are herein meant to be included.

I claim:

1. A package for a micromagnetic memory, comprising:
   a plurality of truncated confocal ellipsoidal means layers and having a common opening therethrough along a central axis for receiving said memory therein, said layers including,
   an outer layer of first type ferromagnetic material for providing a shield against external fields,
   an inner layer of second type ferromagnetic material for producing a static field transverse to said central axis substantially uniformly throughout the spatial volume defined by said opening,
   an inner layer comprising an electromagnetic coil structure for generating a time varying field in said volume for controlling a micromagnetic data storage element of said micromagnetic memory, and
   an inner layer of third type ferromagnetic material located between the layer of second type ferromagnetic material and said electrical coil structure for providing a flux return path for the time varying field generated by said coil structure and increasing the permeance of said inner layer of second type ferromagnetic material.

2. The package as defined by claim 1 wherein said layer of third type ferromagnetic material comprises a layer of relatively low or intermediate permeability material.

3. The package as defined by claim 2 wherein said outer layer of first type ferromagnetic material comprises "soft" material characterized by a relatively high permeability,
   and wherein said at least one inner layer of second type ferromagnetic material comprises "hard" material characterized by a permanent magnetization.

4. A housing structure which provides bias fields, drive fields and shielding for a micromagnetic memory, including a bubble memory, comprising:
   a plurality of truncated confocal ellipsoidal means layers and having a common elongated central opening therethrough for receiving said memory therein, said layers including,
   at least one outermost layer of first type ferromagnetic material having a relatively high permeability for providing a shield against external fields,
   at least one inner layer of second type ferromagnetic material having a permanent magnetization for producing a constant bias field substantially uniformly transverse to a longitudinal central axis through said opening
   a first electromagnetic coil layer interiorally of said at least one inner layer comprising a drive coil for generating a time varying axial field for controlling a data storage element of said memory,
   a second electromagnetic coil layer interior of said one inner layer comprising another drive coil for generating a time varying transverse field across said central axis for controlling said data storage element, and
   at least one "leaky shield" layer of third type ferromagnetic material having a relatively low or intermediate permeability interposed between the inner layer of second type ferromagnetic material and said first and second electromagnetic coil layer for producing a flux return path for said time varying fields and increasing the permeance of said inner layer of second type electromagnetic material.

5. The structure as defined by claim 4 wherein said first and second coil layers include windings having electrical conductors which respectively run parallel to and transverse to said longitudinal central axis.

6. The structure as defined by claim 4 and additionally including a third electromagnetic coil layer interior of said inner layer of second type ferromagnetic material for generating an erasure field transverse to said central axis for said data storage element.

7. The structure as defined by claim 4 and additionally including a second layer of first type ferromagnetic material inwardly adjacent and separated from said first layer of first type ferromagnetic material whereby said outermost layer of first type ferromagnetic material operates as a shield layer and said second layer of first type ferromagnetic material operates as a flux return layer for said at least one inner layer of second type ferromagnetic material having a permanent magnetization.

8. The structure as defined by claim 7 and additionally including a layer of non-magnetic material located between said first and second layers of first type ferromagnetic material.

9. The structure as defined by claim 4 and additionally including a second layer of second type ferromagnetic material adjacent said at least one layer of second type ferromagnetic material, said layers of second type ferromagnetic material being rotatable relative to one another to vary the magnitude of the static permanent magnet field generated thereby without changing its direction.

10. The structure as defined by claim 9 wherein said first and second layers of second type ferromagnetic material are comprised of the same material.

11. The structure as defined by claim 4 wherein said at least one inner layer of second type ferromagnetic material is subdivided into contiguous layers of different material for tailoring the temperature characteristic thereof.

12. The structure as defined by claim 4 wherein said means layers comprise annular cylindrical tube members of substantially equal length.

13. The structure as defined by claim 12 wherein said annular cylindrical tube members are contiguous one to another.

14. The structure as defined by claim 13 wherein said cylindrical tubular members are substantially circular in cross section.

15. The structure as defined by claim 4 wherein said first and second electromagnetic coil layers are comprised of electrical coils wound in opposite angular directions with respect to the central axis.

16. The structure as defined by claim 15 wherein said coils are oriented at an angle of substantially 45° with respect to the central axis.

* * * * *